(12) United States Patent
Schoen et al.

(10) Patent No.: US 10,473,683 B2
(45) Date of Patent: Nov. 12, 2019

(54) SENSOR ELEMENT FOR THERMAL ANEMOMETRY

(71) Applicant: Robert Bosch GmbH, Stuttgart (DE)

(72) Inventors: Florian Schoen, Altdorf (DE); Christian Lemier, Reutlingen (DE); Torsten Kramer, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 174 days.

(21) Appl. No.: 15/482,173

(22) Filed: Apr. 7, 2017

(65) Prior Publication Data

US 2017/0299622 A1  Oct. 19, 2017

(30) Foreign Application Priority Data

Apr. 19, 2016 (DE) .......... 10 2016 206 549

(51) Int. Cl.
| | |
|---|---|
| *G01P 5/12* | (2006.01) |
| *G01F 1/692* | (2006.01) |
| *G01F 1/684* | (2006.01) |
| *B81B 3/00* | (2006.01) |
| *G01F 1/86* | (2006.01) |

(52) U.S. Cl.
CPC .............. *G01P 5/12* (2013.01); *B81B 3/0081* (2013.01); *G01F 1/684* (2013.01); *G01F 1/692* (2013.01); *G01F 1/86* (2013.01); *B81B 2201/0278* (2013.01); *B81B 2203/0127* (2013.01)

(58) Field of Classification Search
CPC ..... G01P 5/10; G01P 5/12; G01F 1/68; G01F 1/69
See application file for complete search history.

(56) References Cited

U.S. PATENT DOCUMENTS

| | | | | |
|---|---|---|---|---|
| 5,393,351 | A * | 2/1995 | Kinard ............... | H01L 35/08 136/200 |
| 6,030,709 | A * | 2/2000 | Jensen ............... | C23C 30/00 338/25 |
| 6,703,132 | B1 * | 3/2004 | Yasuda ............. | B81C 1/00896 324/244 |
| 6,820,481 | B1 * | 11/2004 | Weber ............... | G01F 1/6845 73/204.23 |
| 6,971,266 | B2 * | 12/2005 | Kawai ............... | G01F 1/692 73/204.26 |
| 7,367,237 | B2 * | 5/2008 | Hsiai ............... | B81C 1/00246 73/204.23 |
| 7,572,660 | B2 * | 8/2009 | Benzel ............. | B81B 7/0006 257/415 |

(Continued)

*Primary Examiner* — Daniel S Larkin
*Assistant Examiner* — Anthony W Megna Fuentes
(74) *Attorney, Agent, or Firm* — Norton Rose Fulbright US LLP; Gerard Messina

(57) ABSTRACT

A sensor element for thermal anemometry includes a semiconductor substrate and a thin-film diaphragm attached to the semiconductor substrate and having a front side and a rear side. A resistive heating element and a temperature-dependent resistor are attached to the front side of the thin-film diaphragm. In the area of the rear side of the thin-film diaphragm, the semiconductor substrate has a first recess. A silicon layer including a recess which merges with the first recess of the semiconductor substrate is located between the thin-film diaphragm and the semiconductor substrate.

8 Claims, 3 Drawing Sheets

(56) References Cited

U.S. PATENT DOCUMENTS

| | | | |
|---|---|---|---|
| 2005/0199973 A1* | 9/2005 | Benzel | B81C 1/00158 257/417 |
| 2008/0188027 A1* | 8/2008 | Fukami | G01F 1/6845 438/54 |
| 2010/0005877 A1* | 1/2010 | Abe | B81B 7/0012 73/204.26 |
| 2010/0139391 A1* | 6/2010 | Sakuma | B81B 3/0072 73/204.26 |
| 2011/0107832 A1* | 5/2011 | Sakuma | G01F 1/6842 73/204.26 |
| 2012/0318058 A1* | 12/2012 | Kimura | G01F 1/6842 73/204.23 |
| 2015/0168195 A1* | 6/2015 | Doi | G01F 1/692 73/204.26 |

* cited by examiner

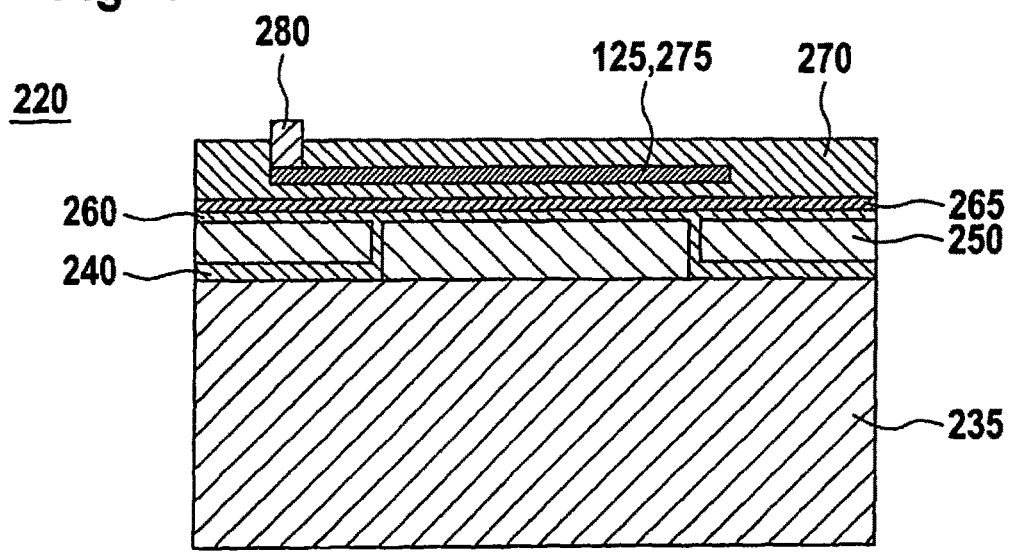
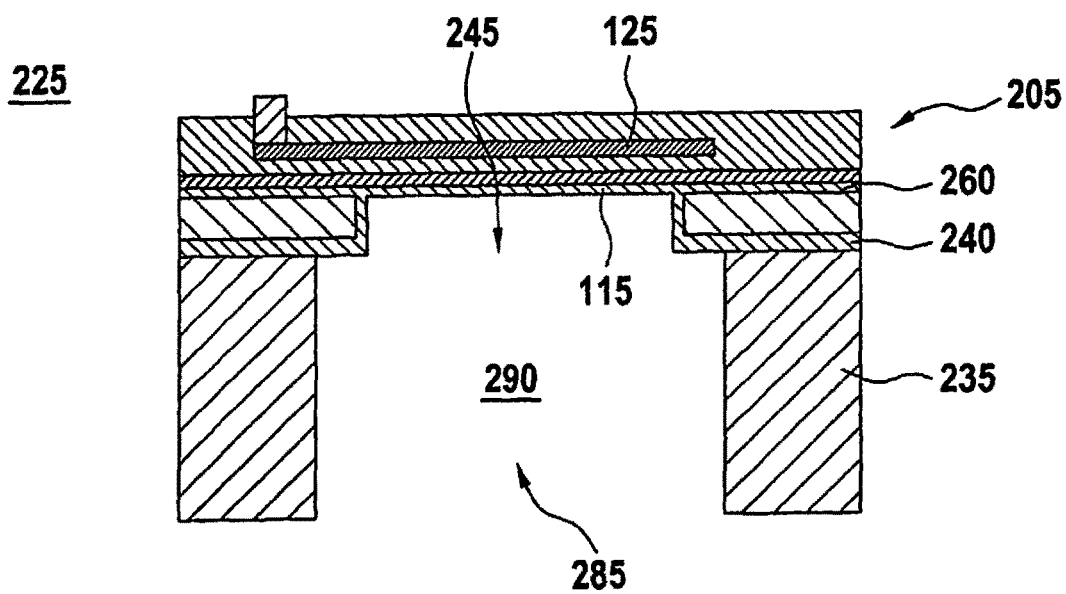

SENSOR ELEMENT FOR THERMAL ANEMOMETRY

CROSS-REFERENCE TO RELATED APPLICATIONS

The present application claims priority under 35 U.S.C. § 119 to DE 10 2016 206 549.1, filed in the Federal Republic of Germany on Apr. 19, 2016, the content of which is hereby incorporated by reference herein in its entirety.

FIELD OF THE INVENTION

The present invention relates to a sensor element for thermal anemometry. In particular, the present invention relates to a semiconductor sensor element for determining a mass flow of a gas.

BACKGROUND

In a motor vehicle, a mass flow of ambient air entering an internal combustion engine is to be determined. The combustion of the internal combustion engine may then be controlled as a function of the mass flow. A hot surface anemometer may be used for determining the mass flow. For this purpose, a diaphragm, which is passed over by the mass flow to be measured, is located on a semiconductor substrate. A heating element and a temperature sensor are attached to the diaphragm. The heating of the diaphragm is a function of a heating power and a flow velocity of the passing medium. Knowledge of additional variables such as the cross section of a passage in the internal combustion engine thus makes it possible to determine the recorded mass flow.

For precise determination of the movement velocity of the passing air, the heating element and the temperature sensor should be attached to the diaphragm with high precision. The diaphragm should be suspended in such a way that a heat dissipation on its edges takes place preferably uniformly and in a predetermined manner. Normally, the sensor element is designed in such a way that the heating element and the temperature sensor are attached to a front side of the diaphragm and a rear side of the diaphragm is exposed using an etching process. For this purpose, lithography and etching process steps on the front side and the rear side should be precisely adjusted in relation to each other. It might not be possible to avoid an adjustment offset, which can be as much as approximately 5 µm in a known method. As a result, the heat dissipation from the diaphragm into the semiconductor substrate may be influenced in an unforeseen manner. In particular, an asymmetrical heat dissipation may take place, which may falsify a measuring result. Furthermore, the transition between the semiconductor substrate and the diaphragm may be defined in a less tidy or less precise manner. For example, lateral boundaries of a cavity on the rear side of the diaphragm may extend at an angle to the diaphragm which is not equal to 90°.

SUMMARY

An object of the present invention is to provide an improved method for providing a high-precision sensor element for thermal anemometry.

According to an example embodiment, a sensor element for thermal anemometry includes a semiconductor substrate and a semiconductor diaphragm attached to the semiconductor substrate, in particular a thin-film diaphragm, having a front side and a rear side. A resistive heating element and a temperature-dependent resistor are attached to the front side. In the area of the rear side of the thin-film diaphragm, the semiconductor substrate has a recess. A silicon layer, including a recess which merges with the recess of the semiconductor substrate, is located between the thin-film diaphragm and the semiconductor substrate.

The thin-film diaphragm is preferably not deposited directly onto a surface of the semiconductor substrate, but instead onto the silicon layer which is used as a base. The silicon layer is structured from the side on which the thin-film diaphragm is formed later. As a result, the transition between the base (the silicon layer) and the semiconductor substrate or between the thin-film diaphragm and the semiconductor substrate can be produced with improved precision. In an example, the recess of the silicon layer and the recess of the semiconductor substrate together form a cavity. An angle between lateral boundaries of the cavity and the thin-film diaphragm can be maintained with improved precision. This makes it possible to avoid a possible notching as well as a possible particle generation when the thin-film diaphragm is exposed.

Influence on the precision of the formed structures by an adjustment offset between process steps on the front side and the rear side of the thin-film diaphragm is avoided. In particular, the position of the heating element or of the temperature-dependent resistor in relation to each other or with regard to boundaries of the thin-film diaphragm or of the cavity can be maintained with improved precision. This makes it possible to prevent an asymmetrical or unforeseen heat dissipation in the area of the thin-film diaphragm. Improved perpendicular boundaries of the cavity make it possible to reduce the space requirement of the cavity in the vertical direction. Reducing the size of the cavity makes it possible to lower manufacturing costs. However, the size of the cavity can also be retained, making it possible to increase the mechanical stability of the sensor element.

Preferably, a first silicon oxide layer is situated between the silicon layer and the semiconductor substrate. The silicon oxide layer can limit a process which removes material on the rear side of the thin-film diaphragm from the semiconductor substrate. This makes it possible to improvably determine the size of the cavity in the vertical direction.

It is further preferred that the silicon layer is coated with a silicon oxide layer in the area of the recess. The silicon oxide layer is to be provided in particular on lateral edges of the silicon layer. This makes it possible to control the extension of the thin-film diaphragm precisely in the horizontal direction.

In one particularly preferred specific embodiment, the thin-film diaphragm is formed as a second silicon oxide layer. Advantageously, the thin-film diaphragm and the first silicon oxide layer are integrally joined. Here, the part of silicon oxide deposited in the lateral area of the recess of the silicon layer preferably forms a connecting element in the vertical direction. The production of the cavity by removing material from the semiconductor substrate and the silicon layer can be limited improvably by the silicon oxide layer, making it possible to improvably determine the dimension and position of the thin-film diaphragm. An adjustment offset between process steps on the front side and the rear side, in particular the removal of material for the cavity, can improve the tolerance levels for the geometry and function of the sensor element.

According to an example embodiment, an air mass flow meter includes the above-described sensor element and also an activation circuit for the heating element for electrically heating the thin-film diaphragm as well as an evaluation circuit for the temperature-dependent resistor for determining a temperature of the thin-film diaphragm. Preferably, a processing unit is additionally provided, which determines an air mass which passes past or through the air mass flow meter per unit of time, based on the heating and the determined temperature as well as, if necessary, additional measured values or constant specifications.

According to an example embodiment, a method for manufacturing a sensor element for thermal anemometry, in particular the above-described sensor element, includes steps of applying a first silicon oxide layer having a recess on one surface of a semiconductor substrate, covering the first silicon oxide layer and the semiconductor substrate with the aid of a silicon layer, covering the silicon layer with the aid of a second silicon oxide layer, applying a resistive heating element and a temperature-dependent resistor on the second silicon oxide layer, and removing the semiconductor substrate and silicon layer in the area of the first silicon oxide layer.

The described method makes it possible to ensure an improved alignment of formed structures on the front side and the rear side of the thin-film diaphragm. A deviation from the relative alignment may have a reduced influence on the quality of the manufactured sensor element.

The semiconductor substrate is preferably removed with the aid of deep reactive ion etching. This process is also known as the Bosch process or trenching. The trenching can include cyclical processing using alternating gases, typically $SF_6$, $CF_x$, $CHF_3$, $C_4F_8$. It is in particular possible to precisely monitor a lateral boundary of the cavity which is produced by removal of material of the semiconductor substrate. This boundary can, in particular, run perpendicularly in relation to the thin-film diaphragm. The formed cavity can obtain a very smooth surface in the lateral direction. A transition between the boundary and the thin-film diaphragm can be determined very precisely in advance. In another specific embodiment, instead of the trenching, a purely chemical process can be used, for example, using potassium hydroxide (KOH).

In another preferred specific embodiment, the silicon layer is provided with a vertical trench in the area of the boundary of the recess of the first silicon oxide layer, and the second silicon oxide layer is applied in such a way that it fills the trench. In another specific embodiment, the trench can also be filled with silicon oxide independently of the second silicon oxide layer. This makes it possible to achieve a lateral boundary of the cavity in the area of the silicon layer acting as a base.

It is further preferred that the trench ends at the first silicon oxide layer, so that both silicon oxide layers at the trench are connected to one another vertically. It is thus possible to improvably control the definition of the thin-film diaphragm and the underlying cavity precisely.

In one specific embodiment, the semiconductor substrate is removed in a larger area than is defined by the recess of the first silicon oxide layer. In other words, the cavity can be designed to be broader from the rear side of the thin-film diaphragm than the thin-film diaphragm is. The above-described method steps make it possible to ensure that the thin-film diaphragm nonetheless has the provided dimensions and maintains a provided position with respect to the cavity.

The present invention is now described in greater detail with reference to the appended drawings.

BRIEF DESCRIPTION OF THE DRAWINGS

FIGS. 2A-2D show the sensor element at various stages of its manufacture and in its finished state, according to an example embodiment.

DETAILED DESCRIPTION

Figure 1:
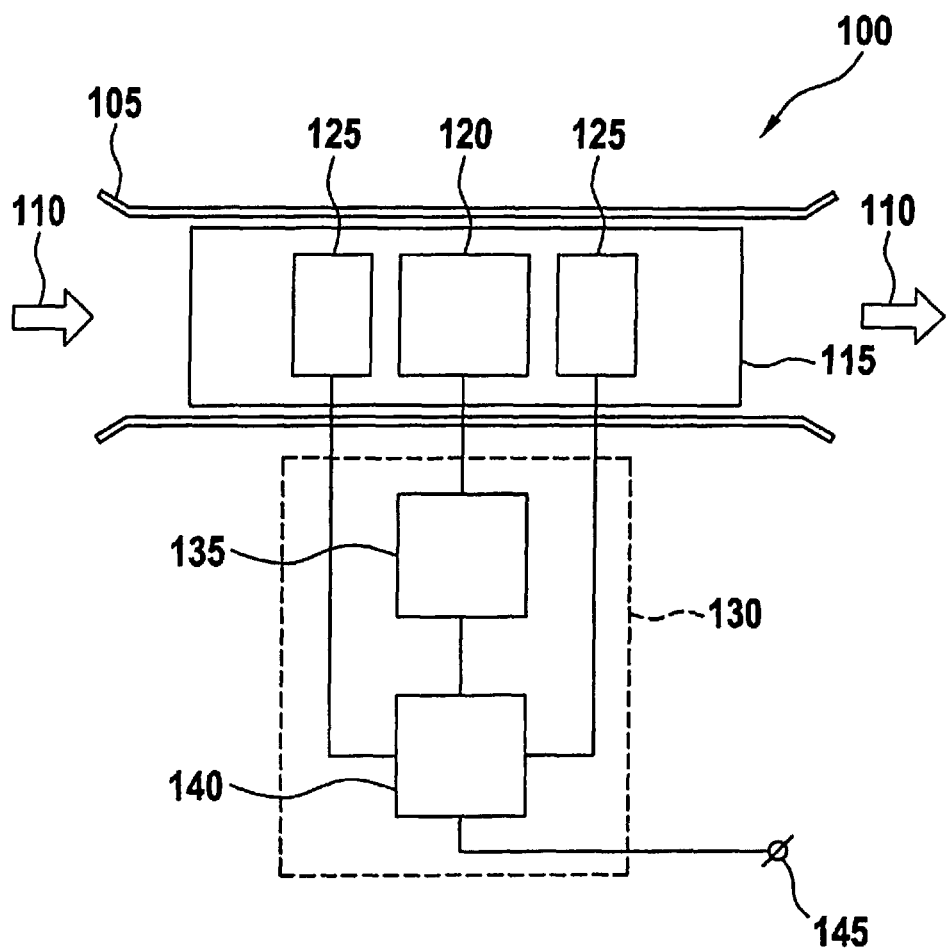
FIG. 1 shows a schematic representation of an air mass flow meter according to an example embodiment.
Figure 2A:
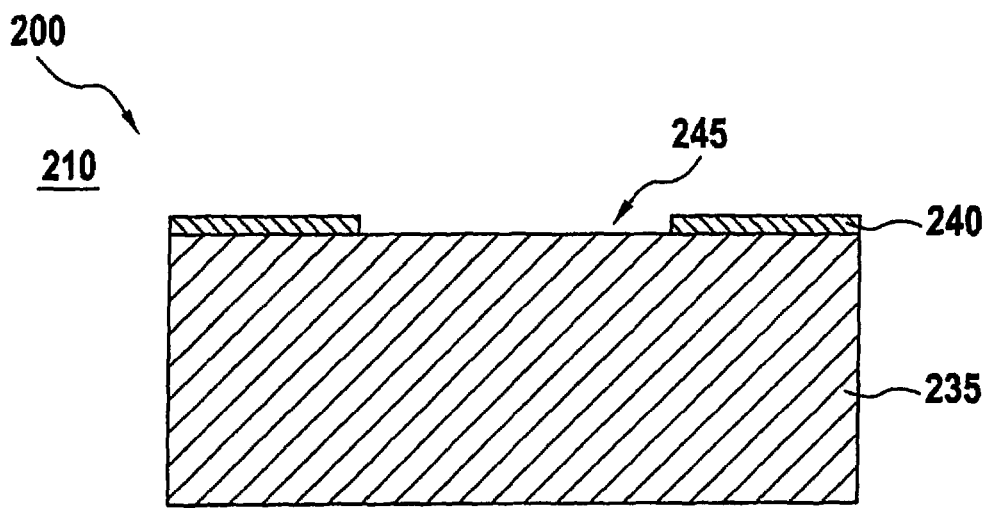
Figure 2B:
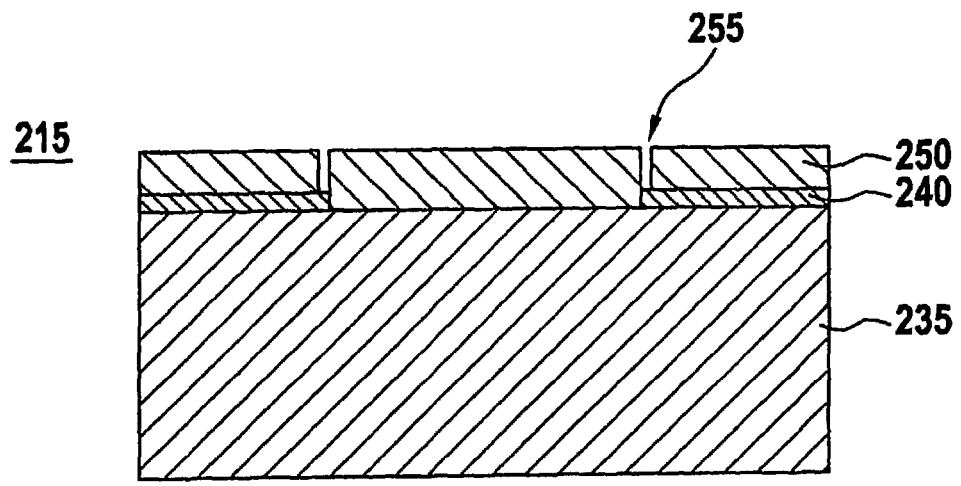

FIG. 1 shows a schematic representation of an air mass flow meter 100 according to an example embodiment. Air mass flow meter 100 is generally designed for determining the flow velocity of a passing medium. In particular, air mass flow meter 100 is designed to be used in a motor vehicle for determining a volume flow of air which, for example, enters an internal combustion engine. For this purpose, air mass flow meter 100 is preferably situated in an area of an intake manifold 105 or a similarly defined passageway for the passage of fluid medium 110, in particular air.

Air mass flow meter 100 includes a diaphragm 115 to which a resistive heating element 120 and two temperature-dependent resistors 125 are attached. Heating element 120 is preferably located between first and second temperature-dependent resistor 125 with respect to a direction of movement of medium 110.

Furthermore, air mass flow meter 100 preferably includes a controller 130 which includes an activating circuit 135 for resistive heating element 120 and an evaluation circuit 140 for determining the temperature of diaphragm 115 in the areas of each of first and second temperature-dependent resistor 125.

If diaphragm 115 is heated in the area of heating element 120, the heat flows via diaphragm 115 to temperature-dependent resistors 125. A movement velocity of fluid medium 110 influences how strongly upstream resistor 125 and downstream resistor 125 are heated. This temperature difference can be determined by evaluation circuit 140 as a function of the heating caused by activating circuit 135 and resistive heating element 120. Preferably, controller 130 additionally includes a processing unit which is configured for determining the velocity of fluid medium 110 or the mass of fluid medium 110 passing through intake manifold 105 per unit of time based on the temperature difference and the activated heating effect. The processing unit can be integrated with evaluation circuit 140 and, in one specific embodiment, includes a programmable microcomputer. A result of the evaluation or processing can be provided externally via an interface 145.

FIGS. 2A-2d show a sensor element 205 for an air mass flow meter 100, such as that of FIG. 1, at various stages of a method 200 of its manufacture. Sensor element 205 includes diaphragm 115, resistive heating element 120, and a temperature-dependent resistor 125. A description of steps of method 200 initially ensues and, subsequently, a more detailed explanation of formed sensor element 205.

In a first step 210, a semiconductor substrate 235, in particular in the form of a silicon wafer, is provided. A first silicon oxide layer 240 is applied on a surface of semiconductor substrate 235. First silicon oxide layer 240 preferably includes silicon dioxide ($SiO_2$). The application can include growing first silicon oxide layer 240 by thermal oxidation or deposition. First silicon oxide layer 240 includes a recess 245 which, in one specific embodiment, is formed by initially applying first silicon oxide layer 240 over a large area on the surface of semiconductor substrate 235 and subsequently removing it again in a predetermined area. The size of recess 245 later determines the shape, size, and position of diaphragm 115.

In a second step 215, first silicon oxide layer 240 and semiconductor substrate 235 are covered in the area of recess 245 with the aid of a silicon layer 250. Silicon layer 250 can in particular be grown epitaxially. The thickness of silicon layer 250 is selected in such a way that requirements for a mechanical stability and sufficient thermal conductivity are met.

Silicon layer 250 is preferably provided with a vertical trench 255 in the area of a boundary of recess 245 of first silicon oxide layer 240. Trench 255 terminates in the vertical direction preferably at first silicon oxide layer 240, immediately adjacent to a lateral boundary of recess 245. Trench 255 can in particular be etched anisotropically, the etching process terminating at first silicon oxide layer 240.

Trench 255 is preferably filled with silicon oxide. For this purpose, a thermal oxidation or, alternatively, a deposition of silicon dioxide can be carried out with the aid of LPCVD (low-pressure chemical vapor deposition). This preferably completely fills trench 255 with silicon oxide.

Optionally, a surface of silicon layer 250 can be planarized using a known CMP (chemical mechanical fabrication) step of semiconductor technology.

In a step 220, diaphragm 115 in the form of a second silicon oxide layer 260, a passivating layer 265, in particular in the form of a nitride layer, a third silicon oxide layer 270, and resistive heating element 120, preferably in the form of a platinum layer 275, are initially applied in succession on the same side of semiconductor substrate 235 using known process steps. Platinum layer 275 is preferably covered both on its upper side and on its underside by third silicon oxide layer 270. A connecting element 280, for example, in the form of an aluminum conducting element, is preferably provided in order to provide an electrical contact to platinum layer 275 through the sheathing of third silicon oxide layer 270. The provision of layers 260 through 275 and connecting element 280 is known in the related art and can be adopted in an arbitrary variant.

In a last step 225, parts of semiconductor substrate 235 and silicon layer 250 are removed in the area of recess 245 of first silicon oxide layer 240. For this purpose, it may be necessary to carry out lithographic steps which are calibrated in their position with respect to the steps carried out on the diametrically opposed side (front side-rear side adjustment). The removal is preferably carried out using reactive ion etching from a rear side of diaphragm 115, i.e., from the side of semiconductor substrate 235. The removal is preferably carried out using reactive ion etching in the Bosch process or one of its refinements. As a result, a cavity 290 is formed under first silicon oxide layer 240, so that second silicon oxide layer 260 forms diaphragm 115 in the area of recess 245 of first silicon oxide layer 240. Depth etching of cavity 290 terminates in the vertical direction at first silicon oxide layer 240 or second silicon oxide layer 260. When trench 255 has been introduced in second step 215 and filled with silicon oxide, the filled silicon oxide forms a lateral boundary of cavity 290 in the area of first recess 245.

Sensor element 205 shown in FIG. 2D includes a diaphragm 115 and a temperature-dependent resistor 125 whose positions in relation to each other and to a cavity 290 under diaphragm 115 are precisely defined. In one exemplary embodiment, diaphragm 115 is approximately 400 μm×400 μm in size. A transition between diaphragm 115 and a boundary of cavity 290 in the area of semiconductor substrate 235 can be precisely determined. A dissipation of heat from diaphragm 115 to semiconductor substrate 235 in an unforeseen or undesirable manner can be prevented. Method steps for defining diaphragm 115 and resistor 125 are carried out from the same side (upper side). A recess 285, which together with recess 245 forms a cavity 290, is introduced into semiconductor substrate 235. Cavity 290 is formed from the opposite side (rear side), but stops at a silicon oxide layer 240, 260 formed in process steps from the front side, and therefore can exactly match one another.

Provided sensor element 205 can be improvably used on air mass flow meter 100 of FIG. 1 in order to determine a temperature on a predetermined location of diaphragm 115 and subsequently, as explained above, based on this determination, to determine a flow velocity or a mass flow of fluid medium 110.

What is claimed is:

1. A sensor element for thermal anemometry, the sensor element comprising:
   a semiconductor substrate;
   a film diaphragm attached to the semiconductor substrate;
   a resistive heating element on a front side of the film diaphragm;
   a temperature-dependent resistor on the front side of the film diaphragm;
   a silicon layer between the film diaphragm and the semiconductor substrate, wherein a first recess, which is in the silicon layer, merges with a second recess, which is in the semiconductor substrate at a rear side of the film diaphragm;
   a first silicon oxide layer between the silicon layer and the semiconductor substrate; and
   wherein the film diaphragm includes a second silicon oxide layer formed in one piece with the first silicon oxide layer.

2. The sensor element of claim 1, wherein the first silicon oxide layer coats the silicon layer.

3. The sensor element of claim 1, wherein the silicon layer is an epitaxial silicon layer.

4. The sensor element of claim 1, wherein the first silicon oxide layer is on a side of the silicon layer.

5. A sensor element for thermal anemometry, the sensor element comprising:
   a semiconductor substrate;
   a film diaphragm attached to the semiconductor substrate;
   a resistive heating element on a front side of the film diaphragm;
   a temperature-dependent resistor on the front side of the film diaphragm;
   a silicon layer between the film diaphragm and the semiconductor substrate, wherein a first recess, which is in the silicon layer, merges with a second recess, which is in the semiconductor substrate at a rear side of the film diaphragm;
   in an area of the first recess, a first silicon oxide layer coating the silicon layer; and
   wherein the film diaphragm includes a second silicon oxide layer formed in one piece with the first silicon oxide layer.

6. The sensor element of claim 5, wherein the first silicon oxide layer is between the silicon layer and the semiconductor substrate.

7. An air mass flow meter comprising:
   a sensor element for thermal anemometry, the sensor element including:
      a semiconductor substrate;
      a film diaphragm attached to the semiconductor substrate;
      a resistive heating element on a front side of the film diaphragm;
      a temperature-dependent resistor on the front side of the film diaphragm;

a silicon layer between the film diaphragm and the semiconductor substrate, wherein a first recess, which is in the silicon layer, merges with a second recess, which is in the semiconductor substrate at a rear side of the film diaphragm; and a first silicon oxide layer between the silicon layer and the semiconductor substrate;

wherein the film diaphragm includes a second silicon oxide layer formed in one piece with the first silicon oxide layer;

an activation circuit for electrically heating the film diaphragm using the heating element; and an evaluation circuit for determining a temperature of the film diaphragm using the temperature-dependent resistor.

8. The air mass flow meter of claim 7, wherein the silicon layer is an epitaxial silicon layer.

\* \* \* \* \*